United States Patent
Latremouille

(10) Patent No.: US 8,386,894 B2
(45) Date of Patent: Feb. 26, 2013

(54) PARALLEL FORWARD ERROR CORRECTION WITH SYNDROME RECALCULATION

(75) Inventor: Damien Latremouille, Ottawa (CA)

(73) Assignee: Applied Micro Circuits Corporation, Sunnyvale, CA (US)

( * ) Notice: Subject to any disclaimer, the term of this patent is extended or adjusted under 35 U.S.C. 154(b) by 882 days.

(21) Appl. No.: 12/409,014

(22) Filed: Mar. 23, 2009

(65) Prior Publication Data

US 2010/0241933 A1    Sep. 23, 2010

(51) Int. Cl.
*G06F 11/00* (2006.01)
(52) U.S. Cl. .......................... 714/785; 714/786; 714/752
(58) Field of Classification Search ................... 714/785, 714/782, 786, 781, 752, 746
See application file for complete search history.

(56) References Cited

U.S. PATENT DOCUMENTS

| 2005/0210353 A1* | 9/2005 | Dohmen et al. ............... 714/746 |
| 2006/0092910 A1* | 5/2006 | Dertz et al. ................... 370/348 |
| 2008/0148127 A1* | 6/2008 | Miyata et al. ................. 714/755 |

* cited by examiner

*Primary Examiner* — Scott Baderman
*Assistant Examiner* — Sarai Butler
(74) *Attorney, Agent, or Firm* — Turocy & Watson, LLP

(57) ABSTRACT

A system and method are provided for parallel processing data that is forward error correction (FEC) protected with multiple codewords. The method accepts an electrical waveform representing a digital wrapper frame of interleaved FEC codewords. Typically, the codeword encoding is solved using an algorithm such as linear block codes, cyclical block codes, Hamming, Reed-Solomon, or Bose-Chaudhuri-Hocquenghem (BCH). The method calculates a first set of syndromes for a first codeword. In parallel with the calculation of the first set of syndromes, a second set of syndromes is calculated for a second codeword with a data component shared with the first codeword. Using the first set of syndromes, an error magnitude and location (EML) of the first codeword is performed. Using the second set of syndromes, an EML of the second codeword is performed in parallel with the EML of the first codeword.

23 Claims, 7 Drawing Sheets

PARALLEL FORWARD ERROR CORRECTION WITH SYNDROME RECALCULATION

BACKGROUND OF THE INVENTION

1. Field of the Invention

This invention generally relates to signal communication and processing and, more particularly, to a system and method for parallely recalculating the syndromes of forward error corrected signals.

2. Description of the Related Art

The bytes in serial communication streams are often interleaved to prevent errors due to relatively long bursts of noise. ITU-T Recommendation G.975. 1, Forward error correction for high bit-rate dense wavelength division multiplexing (DWDM) submarine systems, is one example of a standardized interleaved forward error correction (FEC) code. Proprietary telecommunication optical transport network (OTN) framers also use forward error correction interleaved codes.

FIG. 1 is diagram depicting a forward error correction (FEC) interleaving scheme using inner and outer codewords (prior art). Although there are any number of possible methods for interleaving FEC codes, the general method for nesting codes is to protect one or more code words (called the inner code) by encoding it's contents within the information portion of one or more additional codewords (called the outer code). This nesting operation may be performed any number of times resulting in any number of nesting levels.

FIG. 2 is a schematic block diagram depicting an FEC pipeline for inner/outer encoding and decoding (prior art). One method for encoding data to be FEC protected is to pass such data to an initial inner encoder. Once the data is encoded and parity check data has been added to the original data, both the data and parity are passed to a second outer encoder. The inner data and parity may or may not be reorganized and redistributed before being passed to the outer encoders. The outer encoder then calculates and adds additional parity check data to protect the inner code's data and parity. These steps may be repeated any number of times to generate any number of codeword nesting levels. The distribution of data from inner codewords within outer codewords is arbitrary and is usually dependent on the desired application in question.

Decoding nested codeword reverses the steps implemented in the encoding pipeline. Encoded data is received and passed to an outer decoder which calculates the syndromes of incoming codewords. The decoder determines if errors have occurred and proceeds to locate and correct data errors from the initially calculated syndrome values. At this point, the data may still contain errors if the data was corrupted beyond the correction capability of the outer FEC code. However, these errors may still be correctable by the inner decoder. After disinterleaving, the data is passed to the inner decoder, which attempts to correct errors by standard syndrome calculation and error location. Optionally, the data may be reinterleaved and be repeatedly decoded through inner and outer decoders. Whether with additional discrete decoders, or by feeding the output of the inner decoder back into the outer decoder, this data may be iteratively decoded through a chain or pipeline of FEC decoders. While the steps of iteratively decoding increases the likelihood of recovering correct data, it comes at a cost in processing time.

It would be advantageous if encoding-nested codewords could decoded in parallel at all levels of nesting to reduce latency.

It would be advantageous if codeword decoding could be implemented using only initially calculated and readjusted codeword syndromes, without further manipulation of the original received data after the initial syndrome calculation. It would be advantageous if data could be stored in a memory device and accessed only when error correction was deemed necessary.

SUMMARY OF THE INVENTION

In pipeline decoders, inner decoders may only start the decoding codewords once the outer decoders have completed their decoding processes. The present invention presents a parallelized decoding process that allows all available decoding resources to simultaneously begin decoding all nested codewords, which reduces overall decoding latency. Due to the independent nature of decoders in the parallel decoder, a trade off can be made between decoding resources, latency, and correction capabilities. Decoding resources are used more efficiently, as decoders need only decode and correct code words known to be in error (i.e. codewords with nonzero syndromes). Since parallel decoders do not need to wait for up-stream decoders to complete the decoding process, and calculated syndromes can be used to identify error-containing codewords, decoding resources can be managed to reduce the duplication of codeword decoding. Further, the amount of data manipulation is minimized since decoding is implemented using only initially calculated and readjusted code word syndromes. There is no need to further manipulate the original received data after the initial syndrome calculation. Data may be stored in a memory device and accessed only when error correction is deemed necessary.

Accordingly, a method is provided for parallel processing data forward error correction (FEC) protected with multiple codewords in a communication device receiver. The method accepts an electrical waveform representing a digital wrapper frame of interleaved FEC codewords. As used herein, a "codeword" is a segment of digital information including payload data and parity protection data. Typically, the codeword encoding is solved using an algorithm such as linear block codes, cyclical block codes, Hamming, Reed-Solomon, or Bose-Chaudhuri-Hocquenghem (BCH). The method calculates a first set of syndromes for a first codeword. In parallel with the calculation of the first set of syndromes, a second set of syndromes is calculated for a second codeword with a data component shared with the first codeword. The data component may be payload, parity, or a combination of payload and parity. Using the first set of syndromes, an error magnitude and location (EML) of the first codeword is performed. Using the second set of syndromes, an EML of the second codeword is performed in parallel with the EML of the first codeword. The EMLs of the first and second codewords may be supplied as an electrical waveform, which may be stored in a memory. As used herein, the EMLs are a type of FEC calculation that uses parity protection data in a codeword to recover payload data.

Using the EML of the second codeword, the first set of syndromes can be refined. Using the EML of the first codeword, the second set of syndromes may be refined in parallel with the refining of the first set of syndromes. Using the refined first set of syndromes, the EML of the first codeword can be refined. Using the refined second set of syndromes, the EML of the second codeword may be refined in parallel with refining the EML of the first codeword.

In one aspect, the calculation of the first set of syndromes for the first codeword includes calculating a first set of syndromes for an inner codeword. Calculating the second set of syndromes for the second codeword includes calculating a second set of syndromes for an outer codeword sharing at least one bit with the inner codeword.

Additional details of the above-described method and a receiver system for parallel processing data that is FEC protected with multiple codewords, are provided below.

DETAILED DESCRIPTION

Figure 1:
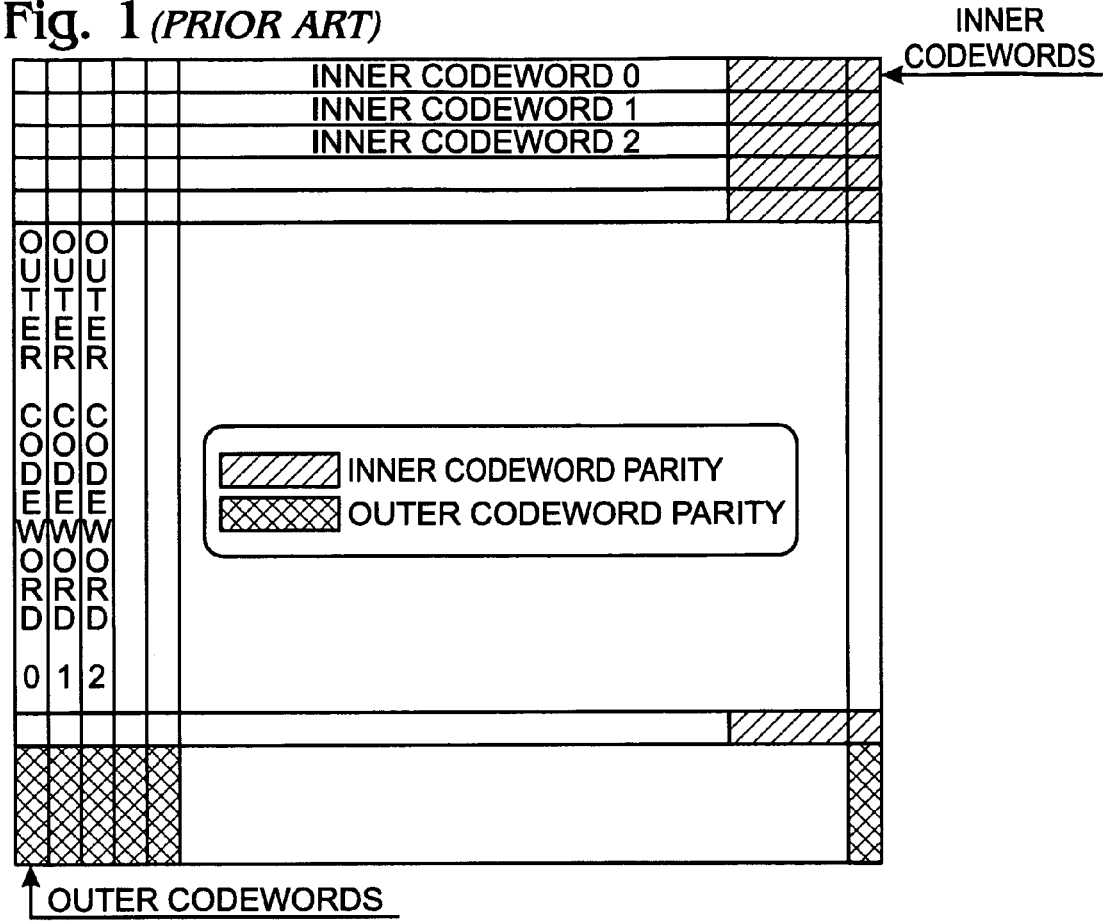
FIG. 1 is diagram depicting a forward error correction (FEC) interleaving scheme using inner and outer codewords (prior art).
Figure 2:
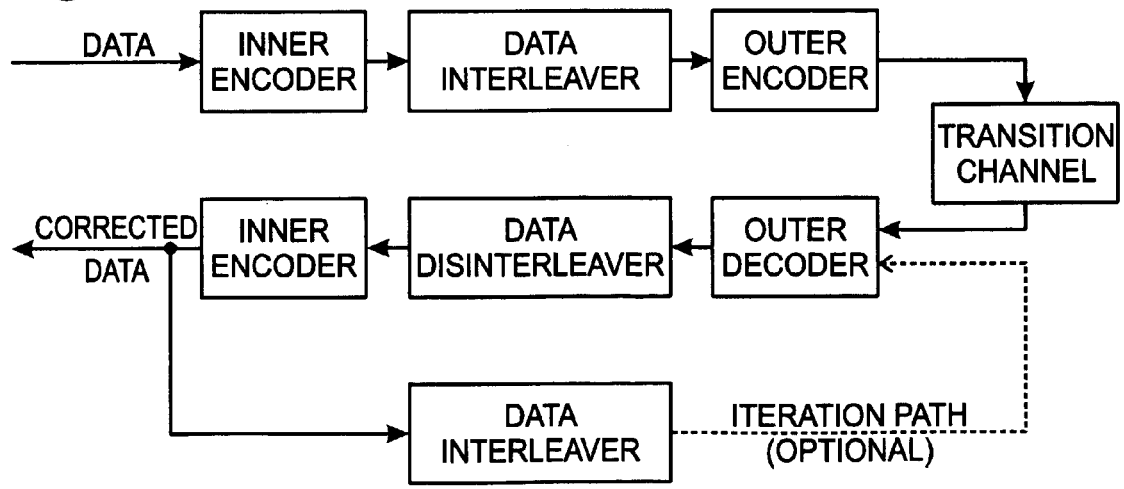
FIG. 2 is a schematic block diagram depicting an FEC pipeline for inner/outer encoding and decoding (prior art).
Figure 3:
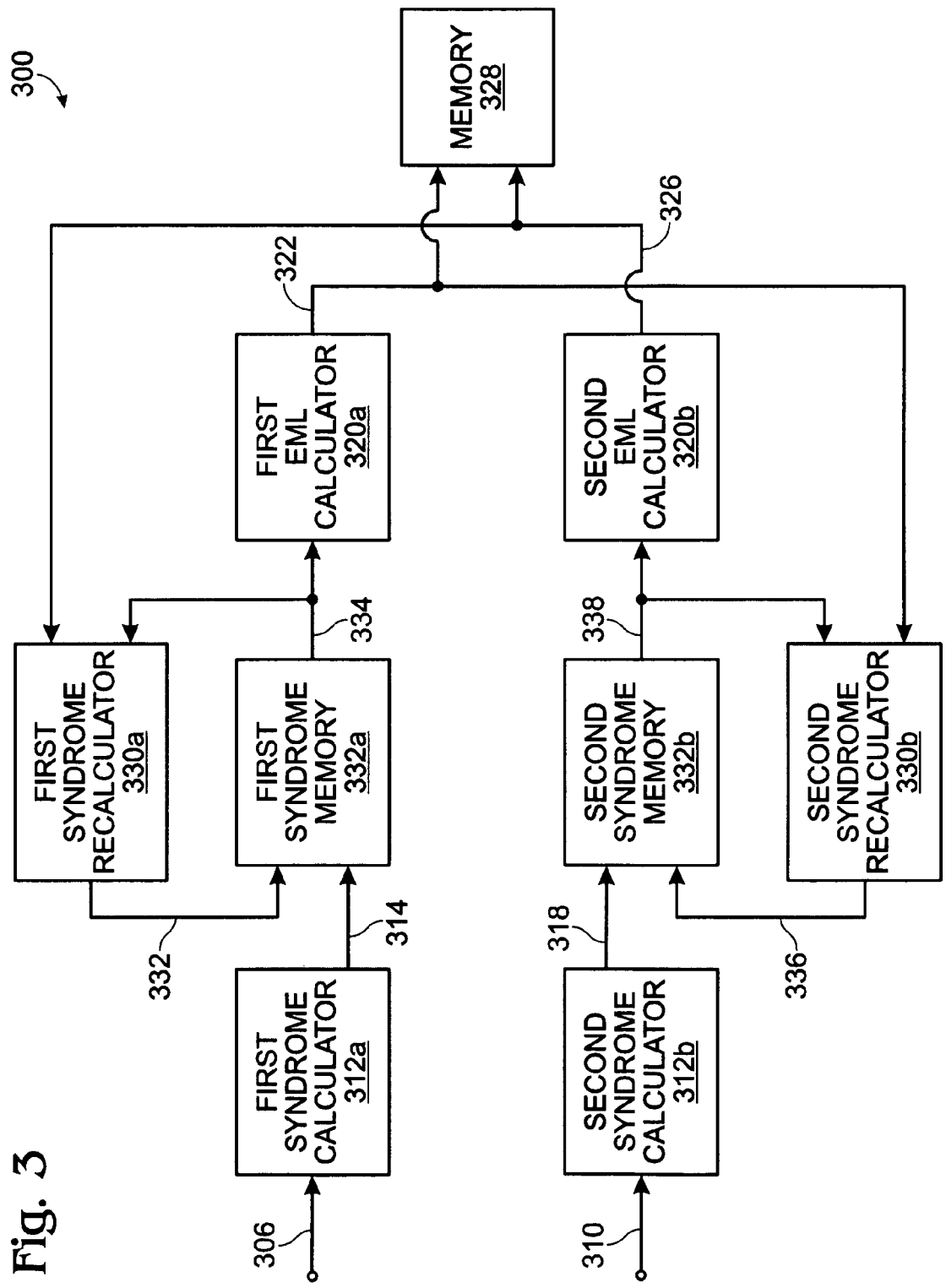
FIG. 3 is a schematic block diagram depicting a communication device receiver with a system for parallel processing data that is FEC protected with multiple codewords.

FIG. 3 is a schematic block diagram depicting a communication device receiver with a system for parallel processing data that is forward error correction (FEC) protected with multiple codewords. As used herein, a codeword is a segment of digital information that includes payload data and parity protection data. The system 300 comprises a first syndrome calculator 312a having an input on line 306 to accept the first codeword and an output on line 314 to supply a first set of syndromes for the first codeword. A second syndrome calculator 312b has an input on line 310 to accept the second codeword and an output on line 318 to supply a second set of syndromes for the second codeword. The second codeword has at least one data component shared with the first codeword. The data component can be payload, parity, or a combination of payload and parity.

In one aspect, the first syndrome calculator 312a provides a first set of syndromes for an inner codeword, while the second syndrome calculator 312b provides a second set of syndromes for an outer codeword sharing at least one bit with the inner codeword. Typically, the codeword encoding that can be solved using an algorithm such as linear block codes, cyclical block codes, Hamming, Reed-Solomon, or Bose-Chaudhuri-Hocquenghem (BCH). However, the system is not limited to any particular type of encoding.

A first error magnitude and location (EML) calculator 320a has an input on line 334 to accept the first set of syndromes, and an output on line 322 to supply error magnitudes and error locations for the first codeword. A second EML calculator 320b has an input on line 338 to accept the second set of syndromes, and an output on line 336 to supply error magnitude and error locations for the second codeword.

In one aspect, the error magnitudes and error locations for the first and second codewords can be stored in memory 328.

In another aspect, the system comprises a first syndrome memory 332a to store the most recent calculation (or recalculation) of the first syndrome from line 314, and a second syndrome memory 332b to store the most recent calculation (or recalculation) of the second syndrome from line 318. A first syndrome recalculator 330a has an input on line 326 to accept the EML of the second codeword, an input of line 334 to accept the first set of syndromes, and an output on line 332 to supply a refined first set of syndromes. A second syndrome recalculator 330b has an input on line 322 to accept the EML of the first codeword, an input on line 338 to accept the second set of syndromes, and an output on line 336 to supply a refined second set of syndromes.

The first EML calculator 320a accepts the refined first set of syndromes and supplies a refined EML of the first codeword on line 322. The second EML calculator 312b accepts the refined second set of syndromes and supplies a refined EML of the second codeword on line 326.

A data path control component, not shown, may manage incoming data and outgoing corrected data, by routing incoming data to codeword decoders and storing the data in memory during the decoding process. Once the data has been corrected, the data path control may fetch the data from memory. Memory 328 may also be used as a data storage device, to buffer the received data during the decoding process.

Figure 4:
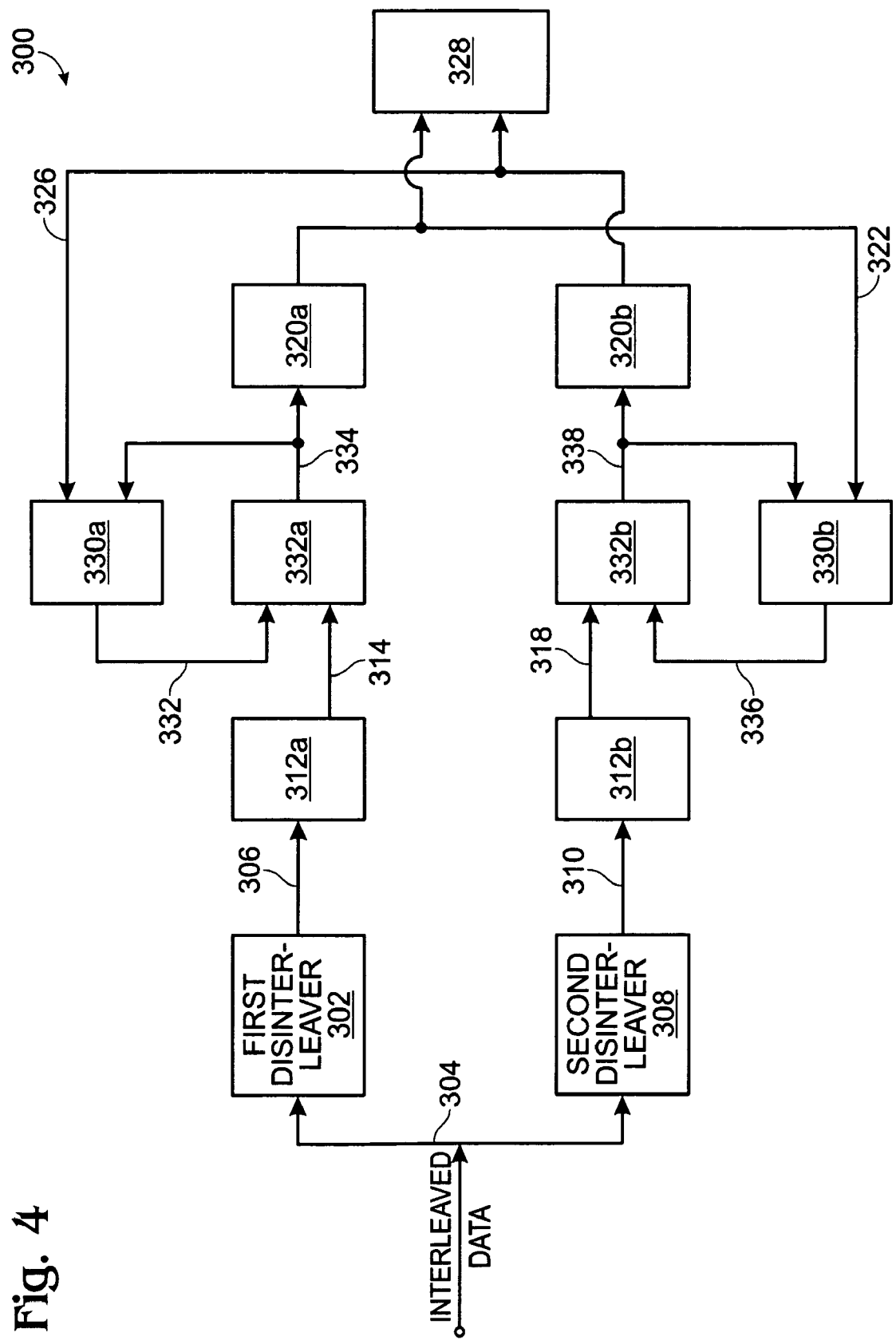
FIG. 4 is a schematic block diagram depicting a first variation of the system for parallel processing data that is FEC protected with multiple codewords.

FIG. 4 is a schematic block diagram depicting a first variation of the system for parallel processing data that is FEC protected with multiple codewords. In this aspect, the data being received via the network interface of line 304 is interleaved. As used herein, interleave means of the arrangement of information segments, such as a bit, byte, multiple bytes, or codewords in a noncontiguous or nonsequential manner. Disinterleaving is the reverse process, the rearrangement of information segments back into a sequential order.

In this aspect, the system 300 comprises a first disinterleaver 302 having a network interface on line 304 to accept a digital wrapper frame of interleaved FEC codewords and an output on line 306 to supply a first codeword. A second disinterleaver 308 has a network interface on line 304 to accept the digital wrapper frame of interleaved FEC codewords and an output on line 310 to supply a second codeword having a data component shared with the first codeword.

Figure 5:
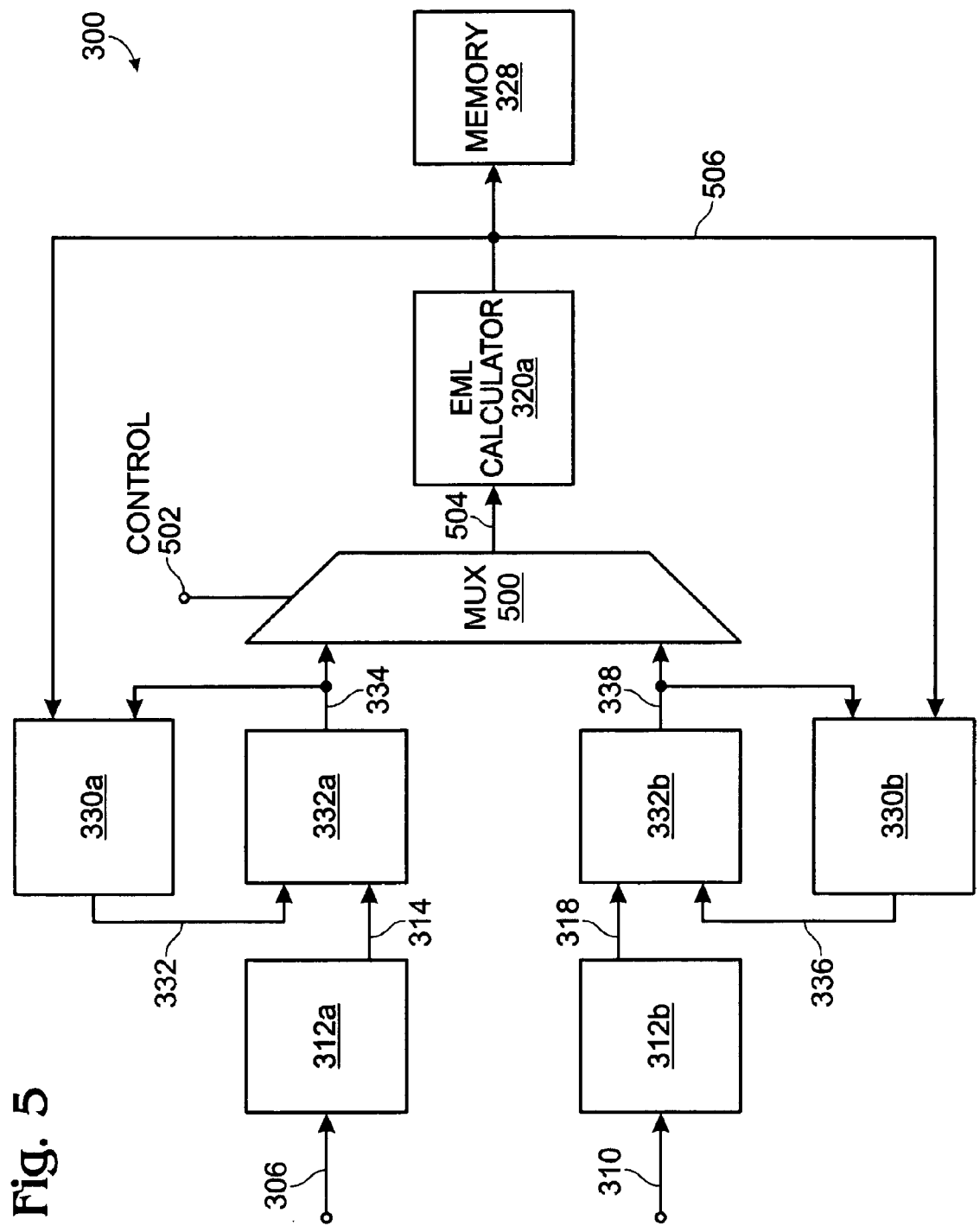
FIG. 5 is a schematic block diagram depicting a second variation of the system for parallel processing data that is FEC protected with multiple codewords.

FIG. 5 is a schematic block diagram depicting a second variation of the system for parallel processing data that is FEC protected with multiple codewords. In addition to the components described above in the explanation of FIG. 3, this aspect of the system includes a multiplexer (MUX) 500 having an interface on lines 334 and 338 to accept the first and second syndrome sets, an input on line 502 to accept a control signal for selecting a set of syndromes, and an output on line 504 to supply the selected set of syndromes.

In this aspect, only a single EML calculator 320a is shown having an input to accept the selected set of syndromes on line 504, and an output on line 506 to supply error magnitudes and error locations for the codeword associated with the selected set of syndromes. Note, although only a single MUX and single EML calculator are shown, the system is not limited to any particular number. If interleaved signals are received, the system can be enabled through the use of disinterleavers, as shown in FIG. 4.

Figure 6:
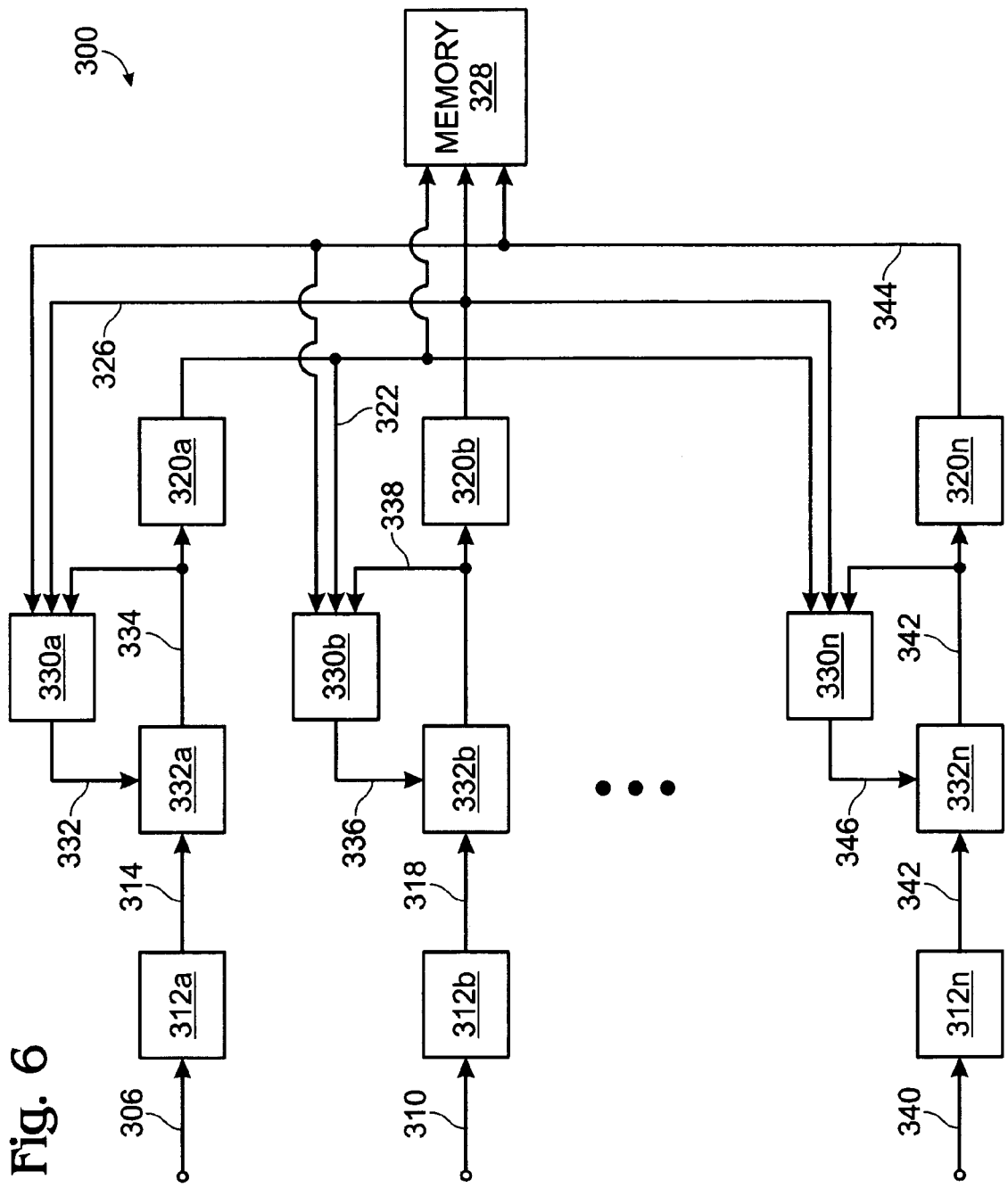
FIG. 6 is a schematic block diagram depicting a third variation of the system for parallel processing data that is FEC protected with multiple codewords.

FIG. 6 is a schematic block diagram depicting a third variation of the system for parallel processing data that is FEC protected with multiple codewords. More generally, the system 300 may be comprised of a plurality of syndrome calculators, EML calculators, and syndrome recalculators. Shown is a third syndrome calculator 312n. In this example n=3. However, the variable n is not limited to any particular value.

The third syndrome calculator 312n has an input on line 340 to accept a third codeword and an output on line 342 to supply a third set of syndromes for the third codeword. The third codeword shares at least one data component, as defined above, with the first and second codewords.

A third EML calculator 320n has an input on line 342 to accept the third set of syndromes, and an output on line 344 to supply an EML of a third codeword. In this aspect, the first syndrome recalculator 330a accepts the EML of the second and third codewords and supplies a refined first set of syndromes. The second syndrome recalculator 330b accepts the EML of the first and third codewords and supplies a refined second set of syndromes. A third syndrome recalculator 330n has an input on line to accept the EML of the first and second codewords and an output to supply a refined third set of syndromes. Since data components are shared by all three codewords, other variations of syndrome recalculation are possible.

The first EML calculator 320a accepts the refined first set of syndromes on line 334, and supplies a refined EML of the first codeword on line 322. The second EML calculator 320b accepts the refined second set of syndromes on line 338, and supplies a refined EML of the second codeword on line 326. The third EML calculator 320n accepts the refined third set of syndromes on line 342, and supplies a refined EML of the third codeword on line 344. In another aspect not shown in this figure, a MUX or a plurality of MUXs may be used as shown in FIG. 5. The MUXs may be used to direct process flow to EML calculators and/or reduce the number of EML calculators needed.

Figure 7:
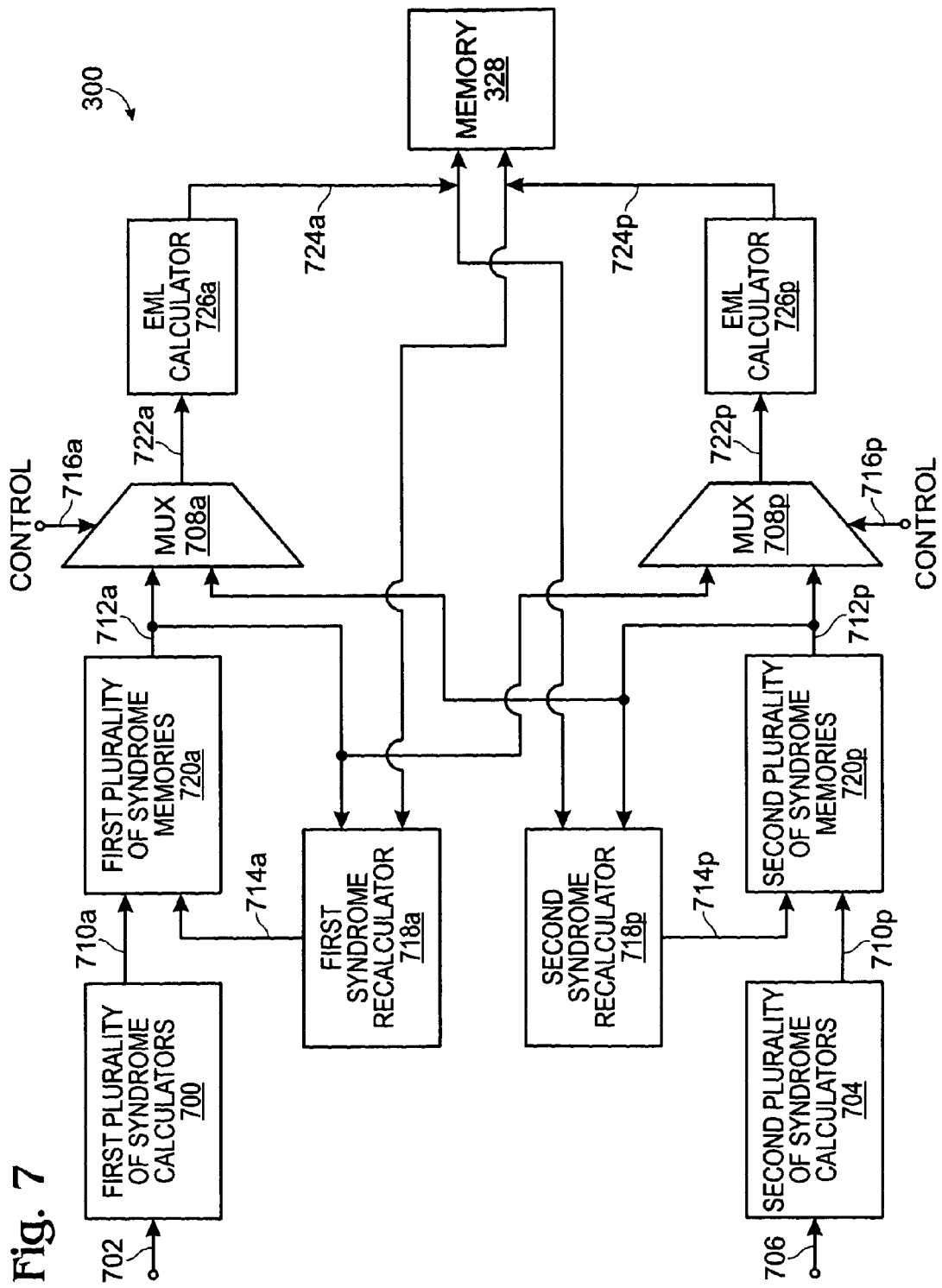
FIG. 7 is a schematic block diagram depicting a fourth variation of the system for parallel processing data that is FEC protected with multiple codewords.

FIG. 7 is a schematic block diagram depicting a fourth variation of the system for parallel processing data that is FEC protected with multiple codewords. A first plurality of syndrome calculators 700 are depicted as a single block for clarity. The first plurality of syndrome calculators 700 has an input to accept corresponding codewords from the first plurality of codewords. For simplicity, the codewords are all shown as accepted on line 702. A second plurality of syndrome calculators are shown represented by block 704. Each syndrome calculator in the second plurality has an input on line 706 to accept a corresponding codeword from the second plurality of codewords.

Also shown is a plurality of MUXs 708a through 708p. In this example p is a variable equal to 2. However, p is not limited to any particular value. Each MUX 708 has an interface on line 712 to accept a set of syndromes from the first and second plurality of syndrome sets, and an input on line 716 to accept a control signal for selecting a set of syndromes. Each MUX 708 has an output on line 722 to supply the selected set of syndromes to an EML calculator. Syndrome memories, 720a and 720p, and a plurality of EML calculators, 726a and 726p, are shown. Typically, the number of EML calculators in this aspect of the system is equal to the number of MUXs. Each EML calculator 726 has an input connected to one of the plurality of MUXs on line 722. A plurality of syndrome recalculators is shown—718a and 718p. Each syndrome recalculator has an input connected to one of the EML calculator outputs, an input to accept syndrome sets, and an output to supply corresponding refined syndrome sets on line 714.

As an alternative to the use of MUXs, the system may employ a plurality of EML calculators, where each EML calculator has an input connected (without a MUX) to one of the plurality of syndrome calculators, to receive syndrome sets or refined syndrome sets. In this alternative, a plurality of syndrome recalculators have inputs connected to the plurality of EML calculator outputs and inputs connected to a plurality of syndrome memories, and each syndrome recalculator has an output connected to supply refined syndrome sets.

The components described above in the explanation of FIGS. 3 through 7 are typically enabled in hardware, due to considerations of speed. However, some or all of the components may be enabled as an application of software coded instructions, which are stored in a memory for a microprocessor device. In that case, the system would also include a memory to store the instructions and a processor to execute the instructions.

Functional Description

Syndrome decoding is a highly efficient method of decoding a linear code over a noisy channel—i.e. one on which errors are made. Linear codes are applied in methods of transmitting symbols (e.g., bits) on a communications channel so that, if errors occur in the communication, some errors can be detected by the recipient of a message block. The codes in the linear code are blocks of symbols which are encoded using more symbols than the original value to be sent. A linear code of length n transmits blocks containing n symbols. The simplest kind of syndrome decoding is Hamming code.

For example, the "(7,4)" Hamming code is a binary linear code which represents 4-bit values each using 7-bit values. In this way, the recipient can detect errors as severe as 2 bits per block. As there are sixteen (16) distinct 4-bit values expressed in binary, the size of the (7,4) Hamming code is sixteen.

In essence, syndrome decoding is minimum distance decoding using a reduced lookup table. It is the linearity of the code that allows for the lookup table to be reduced in size.

Suppose that $$C \subset \mathbb{F}_2^n$$

is a linear code of length n and minimum distance d with parity-check matrix H. Then, C is capable of correcting up to $$t = \left\lfloor \frac{d-1}{2} \right\rfloor$$

errors made by the channel. If no more than t errors are made, then minimum distance decoding will still correctly decode the incorrectly transmitted codeword.

Now suppose that a codeword $$x \in \mathbb{F}_2^n$$

is sent over the channel and the error pattern $$e \in \mathbb{F}_2^n$$

occurs. Then z=x+e is received. Ordinary minimum distance decoding would lookup the vector z in a table of size |C| for the nearest match—i.e. an element (not necessarily unique)

$$c \in C \text{ with}$$

$$d(c,z) \leq d(y,z)$$

for all y∈C Syndrome decoding takes advantage of the property of the parity matrix that:

$$Hx = 0$$

for all x∈C. The syndrome of the received z=x+e is defined to be:

$$Hz = H(x+e) = Hx + He = 0 + He = He$$

Under the assumption that no more than t errors are made during transmission, the receiver looks up the value He in a table of size $$\Sigma_{i=0}^{t}\binom{n}{i} < |C|$$

(for a binary code) against pre-computed values of He for all possible error patterns $e \in \mathbb{F}_2^n$. Knowing what e is, it is then trivial to decode x as:

$$x = z - e$$

Forward error correction (FEC) is a system of error control for data transmission, whereby the sender adds redundant data to its messages, also known as an error correction code. This allows the receiver to detect the magnitude and location of errors, and correct errors (within some bound) without the need to ask the sender for additional data. The advantage of forward error correction is that a back-channel is not required, or that retransmission of data can often be avoided, at the cost of higher bandwidth requirements. FEC is therefore applied in situations where retransmissions are relatively costly or impossible.

FEC devices are often located close to the receiver of an analog signal, in the first stage of digital processing after a signal has been received. That is, FEC circuits are often an integral part of the analog-to-digital conversion process, and also involving digital modulation and demodulation, or line coding and decoding.

The maximum fraction of errors that can be corrected is determined in advance by the design of the code, so different forward error correcting codes are suitable for different conditions. FEC is accomplished by adding redundancy to the transmitted information using a predetermined algorithm. Each redundant bit is invariably a complex function of many original information bits. The original information may or may not appear in the encoded output; codes that include the unmodified input in the output are systematic, while those that do not are nonsystematic.

In practice, FEC codes typically examine the last several dozen, or even the last several hundred, previously received bits to determine how to decode the current small handful of bits (typically in groups of 2 to 8 bits). Such triple modular redundancy, the simplest form of forward error correction, is widely used. FEC could be said to work by "averaging noise"; since each data bit affects many transmitted symbols, the corruption of some symbols by noise usually allows the original user data to be extracted from the other, uncorrupted received symbols that also depend on the same user data.

Because of this "risk-pooling" effect, digital communication systems that use FEC tend to work well above a certain minimum signal-to-noise ratio and not at all below it. This all-or-nothing tendency becomes more pronounced as stronger codes are used that more closely approach the theoretical limit imposed by the Shannon limit. Interleaving FEC coded data can reduce the all or nothing properties of transmitted FEC codes. However, this method has limits. It is best used on narrowband data.

The two main categories of FEC are block coding and convolutional coding. Block codes work on fixed-size blocks (packets) of bits or symbols of predetermined size. Convolutional codes work on bit or symbol streams of arbitrary length. A convolutional code can be turned into a block code, if desired. Convolutional codes are most often decoded with the Viterbi algorithm, though other algorithms are sometimes used.

There are many types of block codes, but the most notable is Reed-Solomon coding because of its widespread use on the Compact disc, the DVD, and in computer hard drives. Golay, BCH, and Hamming codes are other examples of block codes.

The error correcting capability of FEC decoders may be strengthened by nesting or interleaving error correcting codes together. For example, an inner code may be strengthened with an orthogonal outer code. In this manner, an otherwise uncorrectable codeword may be rendered correctable by the application of a protected orthogonal code. The systems described in FIGS. 3-7 permit such codes may be decoded in parallel without the need to disinterleave and reinterleave encoded data between separate orthogonal decoders. A decoder may adjust initially calculated syndromes to account for a correction applied by a corresponding orthogonal decoder. By adjusting calculated syndromes as errors are found, decoding resources need not be pipelined and several optimizations may be made.

The system uses a method for decoding multiple orthogonal FEC code words in parallel by recalculating syndromes. FEC codes that can be decoded by syndrome calculation have the mathematical property in which calculated syndromes are independent of the originally encoded data. These calculated syndromes depend only on errors introduced after the initial encoding. Once the initial syndromes have been calculated, FEC decoders no longer need to consider the actual contents of the received codeword to locate codeword errors.

When decoding nested codewords, correcting errors modifies the data for all subsequent downstream decoders. However, since syndromes depend only on codeword errors and not the actual contents of the originally encoded codeword, error corrections modify all syndromes to be calculated by downstream decoders. Thus, the discovery of a bit error in a particular codeword has a deterministic effect on all downstream decoders. Downstream syndromes need not be completely recalculated when errors are found. It is sufficient to adjust the originally calculated syndromes to account for a newly discovered error.

Since syndromes can be adjusted for newly discovered errors, it is not necessary for downstream decoders to wait for upstream decoders to complete their decoding process. All decoding resources may begin the decoding process as soon as syndromes have been calculated. If errors are discovered by one decoder, previously calculated syndromes in other decoders are adjusted accordingly and decoding continues. If errors are found that require the recalculation of syndromes currently being decoded, the decoding process must be aborted and restarted using the new adjusted syndromes.

Since codewords can be decoded in parallel at all levels of nesting, there is no need for pipelining, where inner decoders may only start the decoding codewords once the outer decoders have completed their decoding processes. Parallelized decoding allows all available decoding resources to simultaneously begin decoding all nested codewords, which reduces overall decoding latency. Decoding resources are used more efficiently since decoders need only decode and correct code words known to be in error, which are the codewords with nonzero syndromes. Since parallel decoders do not need to wait for up-stream decoders to complete the decoding process, and calculated syndromes can be used to identify error containing codewords, decoding resources can be managed to reduce the duplication of codeword decoding. Since decoding is implemented using only initially calculated and readjusted code word syndromes, no further manipulation of the original received data is needed after initial syndrome calculation.

Figure 8:
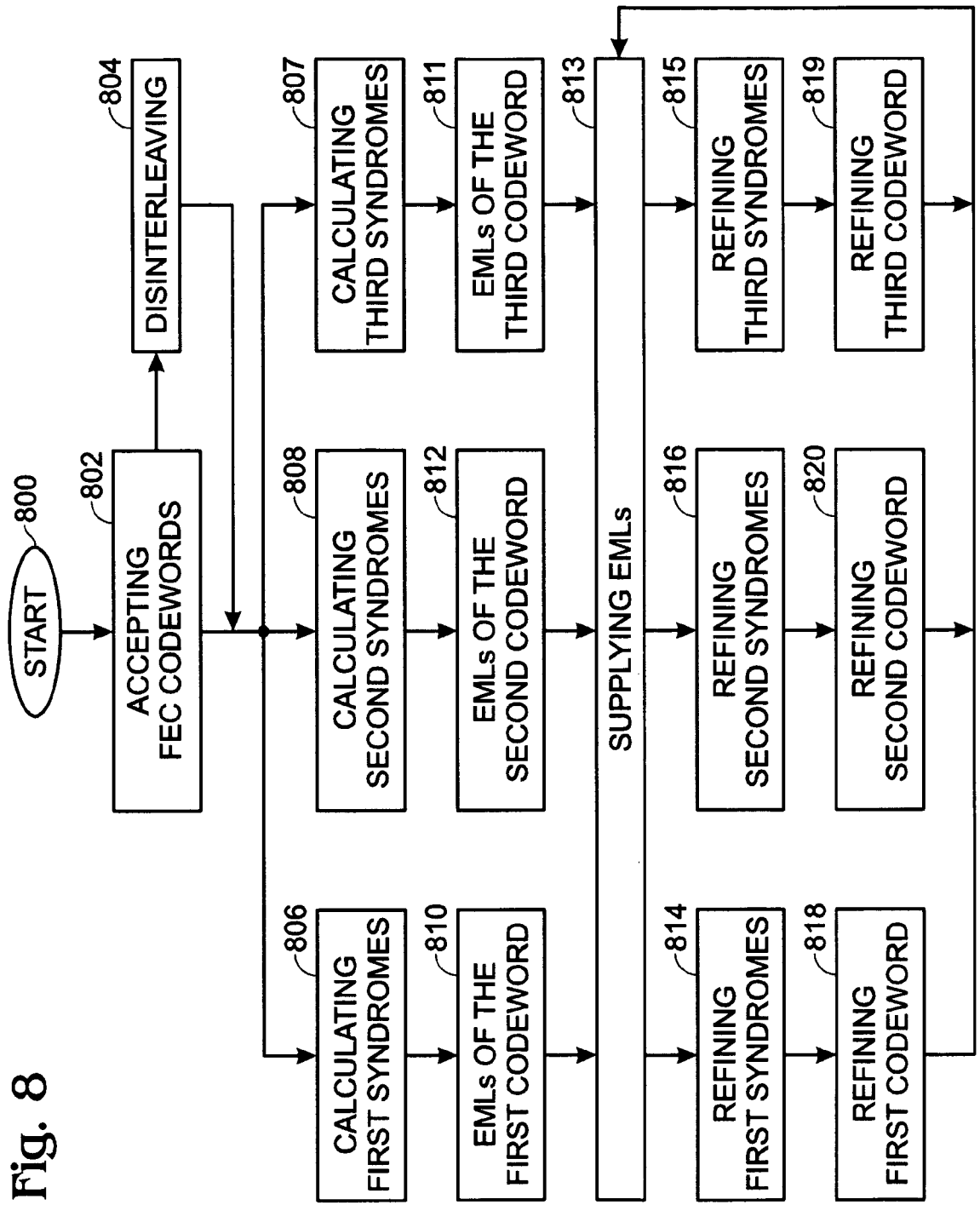
FIG. 8 is a flowchart illustrating a method for parallel processing data FEC protected with multiple codewords in a communication device receiver.

FIG. 8 is a flowchart illustrating a method for parallel processing data FEC protected with multiple codewords in a communication device receiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 accepts an electrical waveform representing a digital wrapper frame of FEC codewords. The codeword encoding can be solved using an algorithm such as linear block codes, cyclical block codes, Hamming, Reed-Solomon, or BCH. Step 806 calculates a first set of syndromes for a first codeword. In parallel with the calculation of the first set of syndromes, Step 808 calculates a second set of syndromes for a second codeword with a data component shared with the first codeword, where the data component is payload, parity, or a combination of payload and parity. It should be understood that the second set of syndromes do not need to be processed in parallel with the first set of syndromes. The availability of parallel processing is an option. Using the first set of syndromes, Step 810 performs an error magnitude and location (EML) of the first codeword. Using the second set of syndromes, Step 812 performs an EML of the second codeword in parallel with the EMLs of the first codeword. Step 813 supplies electrical waveforms representing the EMLs of the first and second codewords. In one aspect, accepting an electrical waveform representing a digital wrapper frame of FEC codewords in Step 802 includes accepting interleaved codewords. Then, prior to calculating the first and second set of syndromes, Step 804 disinterleaves the digital wrapper frame.

As an example, calculating the first set of syndromes for the first codeword is Step 806 includes calculating a first set of syndromes for an inner codeword. Then, calculating the second set of syndromes for the second codeword in Step 808 includes calculating a second set of syndromes for an outer codeword sharing at least one bit with the inner codeword. However, inner and outer codewords are only one means by which different codewords may be nested to share data components.

Using the EML of the second codeword, Step 814 refines the first set of syndromes. Using the EML of the first codeword, Step 816 refines the second set of syndromes in parallel with the refining of the first set of syndromes. Using the refined first set of syndromes, Step 818 refines the EML of the first codeword, and supplies an electrical waveform representing the refined EML of the first codeword. Using the refined second set of syndromes, Step 820 refines the EML of the second codeword in parallel with refining the EML of the first codeword, and supplies an electrical waveform representing the refined EML of the second codeword.

In one aspect, in parallel with the calculation of the first and second set of syndromes, Step 807 calculates a third set of syndromes for a third codeword having data components shared with the first and/or second codewords. Using the third set of syndromes, Step 811 performs an EML of the third codeword in parallel with the EMLs of the first and second codewords, and supplies an electrical waveform representing the EML of the third codeword. Using the EML of the third codeword, Step 814 refines the first and second sets of syndromes. In this aspect the EML of the first codeword is used to refine the second and third sets of syndromes in Step 816. In this aspect, the EML of the second codeword is used to refine the first and third sets of syndromes in Step 815.

To continue, the refined first set of syndromes is used in Step 818 to refine the EML of the first codeword, and supply an electrical waveform representing the refined EML of the first codeword. Likewise, the refined second set of syndromes is used in Step 820 to refine the EML of the second codeword in parallel with refining the EML of the first codeword. Using the refined third set of syndromes, Step 819 refines the EML of the third codeword in parallel with refining the EMLs, of the first and second codewords, and supplies an electrical waveform representing the refined EML of the third codeword.

More generally, calculating the first set of syndromes in Step 806 includes parallely calculating a first plurality of syndrome sets for a first plurality of codewords. Likewise, calculating the second syndrome in Step 808 includes parallely calculating a second plurality of syndrome sets in parallel with the calculation of the first plurality of syndrome sets, where codewords from the second plurality of codewords include data components shared with codewords from the first plurality of codewords.

In this aspect, Step 810 includes the substeps of: selecting a set of syndromes from the first plurality of syndrome sets; performing an EML of the codeword associated with the selected set of syndromes; and, supplying an electrical waveform representing the EML of the selected codeword. Likewise, Step 812 includes the substeps of: selecting a set of syndromes from the second plurality of syndrome sets; performing an EML of the codeword associated with the selected set of syndromes; and, supplying an electrical waveform representing the EML of the selected codeword.

Decoding continues using the steps depicted in FIG. 8 until all the syndromes are reduced to 0, or an exit condition is generated. An exit condition may be a minimally accepted syndrome value (greater than 0) or the expiration of a timer.

A system and method have been provided for parallel processing of data that is FEC protected with multiple codewords. Examples of different encoding and codeword data component sharing schemes have been given to illustrate the invention. However, the invention is not limited to merely these examples. Other variations and embodiments of the invention will occur to those skilled in the art.

I claim:

1. In a communication device receiver, a method for parallel processing data forward error correction (FEC) protected with multiple codewords using inner and outer decoding, the method comprising: accepting an electrical waveform representing a digital wrapper frame of FEC codewords; calculating a first set of syndromes for a first codeword; in parallel with the calculation of the first set of syndromes, calculating a second set of syndromes for a second codeword with a data component selected from a group consisting of payload, parity, and a combination of payload and parity, shared with the first codeword; using the first set of syndromes, performing an error magnitude and location (EML) of the first codeword; using the second set of syndromes, performing an EML of the second codeword in parallel with the EML of the first: codeword; and, supplying electrical waveforms representing the EMLs of the first and second codewords.

2. The method of claim 1 further comprising:
using the EML of the second codeword, refining the first set of syndromes; and,
using the EML of the first codeword, refining the second set of syndromes in parallel with the refining of the first set of syndromes.

3. The method of claim 2 further comprising:
using the refined first set of syndromes, refining the EML of the first codeword and supplying an electrical waveform representing the refined EML of the first codeword; and,
using the refined second set of syndromes, refining the EML of the second codeword in parallel with refining the EML of the first codeword and supplying an electrical waveform representing the refined EML of the second codeword.

4. The method of claim 1 further comprising:
in parallel with the calculation of the first and second set of syndromes, calculating a third set of syndromes for a third codeword having data components shared with a codeword selected from a group consisting of the first codeword, the second codeword, and the first and second codewords;
using the third set of syndromes, performing an EML of the third codeword in parallel with the EMLs of the first and second codewords and supplying an electrical waveform representing the EML of the third codeword;
using the EML of the third codeword, refining the first and second sets of syndromes;
using the EML of the first codeword, refining the second and third sets of syndromes in parallel with the refining of the first set of syndromes; and,
using the EML of the second codeword, refining the first and third sets of syndromes inn parallel with the refining of the first and second set of syndromes.

5. The method of claim 4 further comprising:
using the refined first set of syndromes, refining the EML of the first codeword, and supplying an electrical waveform representing the refined EML of the first codeword;
using the refined second set of syndromes, refining the EML of the second codeword in parallel with refining the EML of the first codeword, and supplying an electrical waveform representing the refined EML of the second codeword; and,
using the refined third set of syndromes, refining the EML of the third codeword in parallel with refining the EMLs of the first and second codewords, and supplying an electrical waveform representing the refined EML of the third codeword.

6. The method of claim 3 wherein calculating the first set of syndromes includes parallely calculating a first plurality of syndrome sets for a first plurality of codewords; and,
wherein calculating the second syndrome includes paraiieiv calculating a second plurality of syndrome sets in parallel with the calculation of the first plurality of syndrome sets, where codewords from the second plurality of codewords include data components shared with codewords from the first plurality of codewords.

7. The method of claim 6 wherein performing the EML of the first codeword includes:
selecting a set of syndromes from the first plurality of syndrome sets; and,
performing an EML of the codeword associated with the selected set of syndromes, and supplying an electrical waveform representing the EML of the selected codeword;
wherein performing the EML of the second codeword includes:
selecting a set of syndromes from the second plurality of syndrome sets; and,
performing an EML of the codeword associated with the selected set of syndromes, and supplying an electrical waveform representing the EML of the selected codeword.

8. The method of claim 1 wherein calculating the first set of syndromes for the first codeword includes calculating a first set of syndromes for an inner codeword; and,
wherein calculating the second set of syndromes for the second codeword includes calculating a second set of syndromes for an outer codeword sharing at least one bit with the inner codeword.

9. The method of claim 1 wherein accepting the digital wrapper frame of interleaved FEC codewords includes accepting codewords with an encoding that Can be solved using an algorithm selected from a group consisting of linear block codes, cyclical block codes, Hamming, Reed-Solomon, and Bose-Chaudhuri-Hocquenghem (BCH).

10. The method of claim 1 wherein accepting an electrical waveform representing a digital wrapper frame of FEC codewords includes accepting interleaved codewords; and,
the method further comprising:
prior to calculating the first and second set of syndromes, disinterleaving the digital wrapper frame.

11. In a communication device receiver, a system for parallel processing data forward error correction (FEC) protected with multiple codewords using inner and outer decoding, the system comprising: a first syndrome calculator having an input to accept a first codeword and an output to supply a first set of syndromes for the first codeword; a second syndrome calculator having an input to accept a second codeword and an output to supply a second set of syndromes for the second codeword, the second codeword having a data component selected from a group consisting of payload, parity, and a combination of payload and parity, shared with the first codeword; a first error magnitude and location (EML) calculator having an input to accept the first set of syndromes, and an output to supply error magnitudes and error locations for the first codeword; and, a second EML calculator having an input to accept the second set of syndromes, and an output to supply error magnitude and error locations for the second codeword.

12. The system of claim 11 further comprising:
a first syndrome memory for storing the first set of syndromes;
a second syndrome memory for storing the second set of syndromes;
a first syndrome recalculator having an input to accept the EML of the second codeword and the first set of syndromes from the first syndrome memory, and an output to supply a refined first set of syndromes; and,
a second syndrome recalculator having an input to accept the EML of the first codeword and the second set of syndromes from the second syndrome memory, and an output to supply a refined second set of syndromes.

13. The system of claim 12 wherein the first EML calculator accepts the refined first set of syndromes and supplies a refined EML of the first codeword; and,
wherein the second EML calculator accepts the refined second set of syndromes and supplies a refined EML of the second codeword.

14. The system of claim 11 further comprising:
a third syndrome calculator having an input to accept a third codeword and an output to supply a third set of syndromes for the third codeword, the third codeword having data components shared with the first and second codewords;
a third EML calculator having an input to accept the third set of syndromes, and an output to supply an EML of a third codeword;
a first syndrome memory for storing the first set of syndromes;
a second syndrome memory for storing the second set of syndromes;

a third syndrome memory for storing the third set of syndromes;

a first syndrome recalculator having an input to accept the EML of the second and third codewords, an input to accept the first set of syndromes from the first syndrome memory, and an output to supply a refined first set of syndromes;

a second syndrome recalculator having an input to accept the EML of the first and third codewords, an input to accept the second set of syndromes from the second syndrome memory, and an output to supply a refined second set of syndromes; and, a third syndrome recalculator having an input to accept the EML of the first and second codewords, an input to accept the third set of syndromes from the third syndrome memory, and an output to supply a refined third set of syndromes.

15. The system of claim 14 wherein the first EML calculator accepts the refined first set of syndromes and supplies a refined EML of the first codeword;

wherein the second EML calculator accepts the refined second set of syndromes and supplies a refined EML of the second codeword; and, wherein the third EML calculator accepts the refined third set of syndromes and supplies a refined EML of the third codeword.

16. The system of claim 13 further comprising:

a first plurality of syndrome calculators, each syndrome calculator having an input to accept a corresponding codeword from the first plurality of codewords; and, a second plurality of syndrome calculators, each syndrome calculator having an input to accept a corresponding codeword from the second plurality of codewords.

17. The system of claim 16 further comprising:

a plurality of multiplexers (MUXs), each MUX having an interface to accept syndrome sets from the first and second plurality of syndrome sets, an input to accept a control signal for selecting a set of syndromes, and an output to supply the selected set of syndromes to an EML calculator;

a plurality of EML calculators, each EML calculator having an input connected to one of the plurality of MUXs;

a first and second syndromes memory for storing a set of syndromes from each one of the first and second plurality of syndrome calculators; and, a first and second plurality of syndrome recalculators, the plurality of syndrome recalculators having inputs connected to the plurality of EML calculator outputs and a corresponding syndrome memory to accept syndrome sets, and an output to supply corresponding refined syndrome sets.

18. The system of claim 16 further comprising:

a first and second plurality of EML calculators, each plurality of EML calculators having inputs connected to receive a corresponding plurality of syndrome sets;

a first and second syndrome memory for storing each set of syndromes; and, a first and second plurality of syndrome recalculators, each plurality of syndrome recalculators having inputs connected to the plurality of EML calculator outputs and a corresponding syndrome memory to accept syndrome sets, and an output to supply corresponding refined syndrome sets.

19. The system of claim 11 wherein the first syndrome calculator provides a first set of syndromes for an inner codeword; and, wherein the second syndrome calculator provides a second set of syndromes for an outer codeword sharing at least one bit with the inner codeword.

20. The system of claim 11 wherein each syndrome calculator accepts codewords with an encoding that can be solved using an algorithm selected from a group consisting of linear block codes, cyclical block codes, Hamming, Reed-Solomon, and Bose-Chaudhuri-Hocquenghem (BCH).

21. The system of claim 11 further comprising:

a first disinterleaver having a network interface to accept a digital wrapper frame of interleaved FEC codewords and an output to supply the first codeword; and, a second disinterleaver having a network interface to accept the digital wrapper frame of interleaved FEC codewords and an output to supply the second codeword.

22. In a communication device receiver, a system for parallel processing data forward error correction (FEC) protected with multiple codewords using inner and outer decoding, the system comprising: a first syndrome calculator having an input to accept a first: codeword and an output to supply a first: set of syndromes for the first codeword; a second syndrome calculator having an input to accept a second codeword and an output to supply a second set of syndromes for the second codeword, the second codeword having a data component selected from a group consisting of payload, parity, and a combination of payload and parity, shared with the first codeword; a multiplexer (MUX) having an interface to accept the first and second syndrome sets, an input to accept a control signal for selecting a set of syndromes, and an output to supply the selected set of syndromes; and an error magnitude and location (EML) calculator having an input to accept the selected set of syndromes, and an output to supply error magnitudes and error locations for the codeword associated with the selected set of syndromes.

23. In a communication device receiver, a method for parallel processing data forward error correction (FEO) protected with multiple codewords using inner and outer decoding, the method comprising: accepting an electrical waveform representing a digital wrapper frame of FEC codewords; calculating a first set of syndromes for a first codeword; in; parallel with the calculation of the first set of syndromes, calculating a second set of syndromes for a second codeword with a data component shared with the first codeword; using the first set of syndromes, performing an error magnitude and location (EML) of the first codeword;

using the second set of syndromes, performing an EML of the second codeword in parallel with the EML of the first codeword; and, supplying electrical waveforms representing the EMLs of the first and second codewords.

* * * * *